(12) United States Patent
Stewart

(10) Patent No.: US 6,750,536 B2
(45) Date of Patent: Jun. 15, 2004

(54) CURRENT SUPPLY AND SUPPORT SYSTEM FOR A THIN PACKAGE

(75) Inventor: Glenn E. Stewart, Mesa, AZ (US)

(73) Assignee: Intel Corporation, Santa Clara, CA (US)

(*) Notice: Subject to any disclaimer, the term of this patent is extended or adjusted under 35 U.S.C. 154(b) by 234 days.

(21) Appl. No.: 10/016,946

(22) Filed: Dec. 14, 2001

(65) Prior Publication Data

US 2003/0111715 A1 Jun. 19, 2003

(51) Int. Cl.⁷ .............................................. H01L 29/00
(52) U.S. Cl. ........................ 257/691; 257/692; 257/693
(58) Field of Search ................................. 257/691, 692, 257/693

(56) References Cited

U.S. PATENT DOCUMENTS

| | | | |
|---|---|---|---|
| 5,909,058 A | * 6/1999 | Yano et al. ................ 257/712 |
| 6,002,165 A | * 12/1999 | Kinsman ................... 257/666 |
| 6,060,774 A | * 5/2000 | Terui ....................... 257/692 |

FOREIGN PATENT DOCUMENTS

JP          63-287026       * 11/1988

* cited by examiner

*Primary Examiner*—Thien F Tran
(74) *Attorney, Agent, or Firm*—Schwegman, Lundberg, Woessner & Kluth, P.A.

(57) ABSTRACT

An electronic package that includes an interposer, a die and laminated conductor. The die and laminated conductor are secured to the interposer such that the laminated conductor mechanically supports the interposer and supplies current to the die.

21 Claims, 4 Drawing Sheets

CURRENT SUPPLY AND SUPPORT SYSTEM FOR A THIN PACKAGE

TECHNICAL FIELD OF THE INVENTION

The present invention relates generally to electronics packaging. More particularly, the present invention relates to an electronic package that includes a die packaged on a thin interposer, and to manufacturing methods related thereto.

BACKGROUND OF THE INVENTION

Integrated circuits (ICs) have typically been assembled into electronic packages by physically and electrically coupling them to a substrate made of organic or ceramic material. One or more such IC packages can be physically and electrically coupled to a secondary substrate such as a printed circuit board or motherboard to form an electronic assembly. The electronic assembly can be part of an electronic system. An electronic system is broadly defined herein as any product having an electronic assembly. Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders or MP3 players.

Manufacturers of electronic systems constantly try to improve product performance while reducing production costs. This is particularly true regarding the packaging of ICs, where each new generation of packaging must provide increased performance at decreased sizes. Therefore, manufacturers of high-end ICs, such as processors, continually develop IC packages that are thinner, lighter-weight, and/or more resilient because such packaging is useful for many applications. A typical package includes an IC, such as a die, that is mounted on an interposer which functionally connects the die through a hierarchy of electrically conductive paths to the other elements that make up the electronic system.

Power delivery is an area of microprocessor development that will be crucial to improving future microprocessors. One of the major limitations associated with power delivery is the inductive path, or loop, between a die and one or more capacitors that provide power to the components in the die before another source, such as a voltage regulator, is able to provide a steady supply of power. This limitation is typically addressed by attaching the capacitors to the underside of a thin interposer that is positioned between the die and the capacitors in order to minimize the distance between the die and the capacitors. Reducing the distance between the capacitors and the die minimizes the inductive loop that is generated when supplying power to the die. However, the thin interposer leads to another problem as the thin interposer is unable to handle the mechanical loads that are generated on the interposer during operation of the integrated circuit.

FIGS. 1 and 2 show two different types of prior art packages. The package 10 illustrated in FIG. 1 includes a die 12 that is mounted onto a thin interposer 14 using a conventional C4 (solder-ball) joint that is supplemented by a conventional underfill 15. A pin carrier 16 is attached to the underside of the interposer 14 to support the interposer 14 along at least the entire area of the die 12. The design of the package 10, in particular the pin carrier 16, does not permit any type of electronic component to be mounted to the underside of the interposer 14 in that area of the interposer which is opposite to the die 12. Therefore, the prior art package 10 shown in FIG. 1 suffers from an inductive path problem.

FIG. 2 shows a prior art package 20 that overcomes the inductive path problem. Package 20 includes a die 22 that is mounted onto a thin interposer 24. Die 22 is similarly mounted to interposer 24 using a conventional C4 joint that is supplemented by a conventional underfill 25. A pin carrier 26 that includes a cavity 27 is mounted to the underside of the thin interposer 24. The cavity 27 in pin carrier 26 is positioned underneath die 22 such that electronic components 28 may be mounted to the underside of interposer 24 opposite to die 22. Placing the electronic components 28 against interposer 24 within cavity 27 of the pin carrier 26 reduces the distance between die 22 and electronic components 28. This reduced distance minimizes the inductive loop problem. However, thin interposer 24 is incapable of withstanding the mechanical load that is applied to package 20 by heat sinks and/or other thermal elements within the integrated circuit. The mechanical load generates package deflection that results in multiple failure modes, including internal damage to the package circuitry and/or damage to the joints that connect the electronic components to interposer 24.

As the internal circuitry of processors operates at higher frequencies, and processors operate at higher power levels, the amount of loop inductance produced within processor packages often increases to unacceptable levels. In addition, the smaller physical size of processor packages makes the packages more fragile and less able to carry higher power loads. Therefore, there is a significant need for a reliable electronics package, and methods of fabricating an electronics package that generates minimal loop inductance within the package yet is mechanically stable.

DETAILED DESCRIPTION OF EMBODIMENTS OF THE INVENTION

In the following detailed description of the invention, reference is made to the accompanying drawings that illustrate different embodiments in which the invention may be practiced. These embodiments are described in sufficient detail to enable those skilled in the art to practice the invention, and it should be understood that changes may be made without departing from the scope of the present invention. The following detailed description does not limit the present invention because the scope of the present invention is defined by the appended claims.

Figure 1:
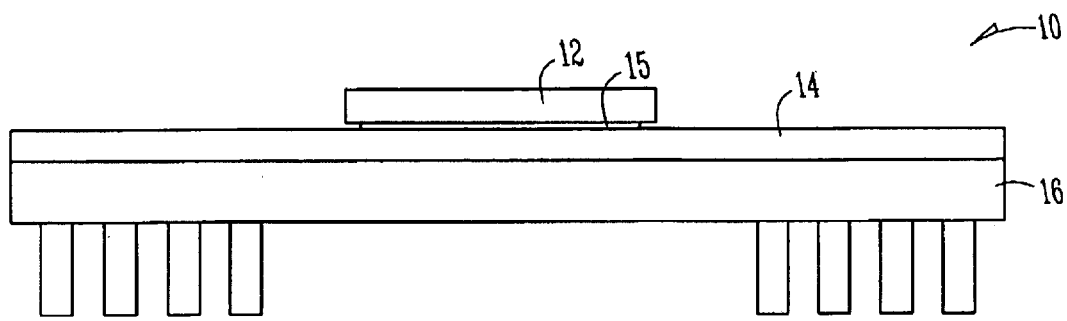
FIG. 1 is a simplified diagram illustrating a prior art package.
Figure 2:
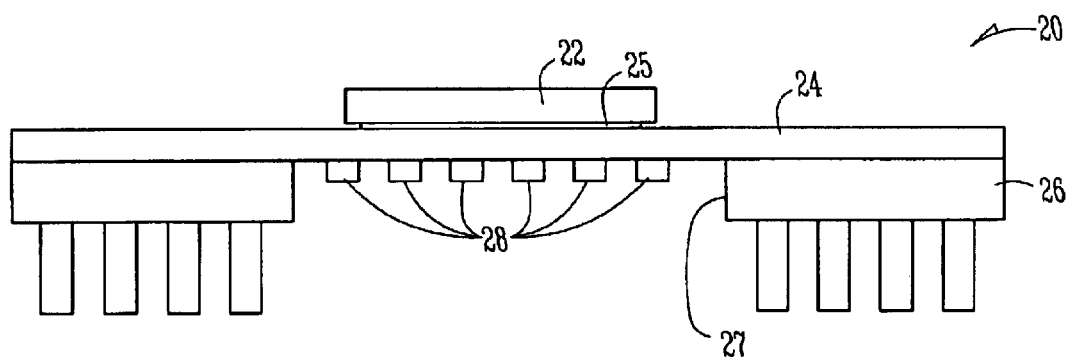
FIG. 2 is a simplified diagram similar to FIG. 1 illustrating another prior art package.
Figure 3:
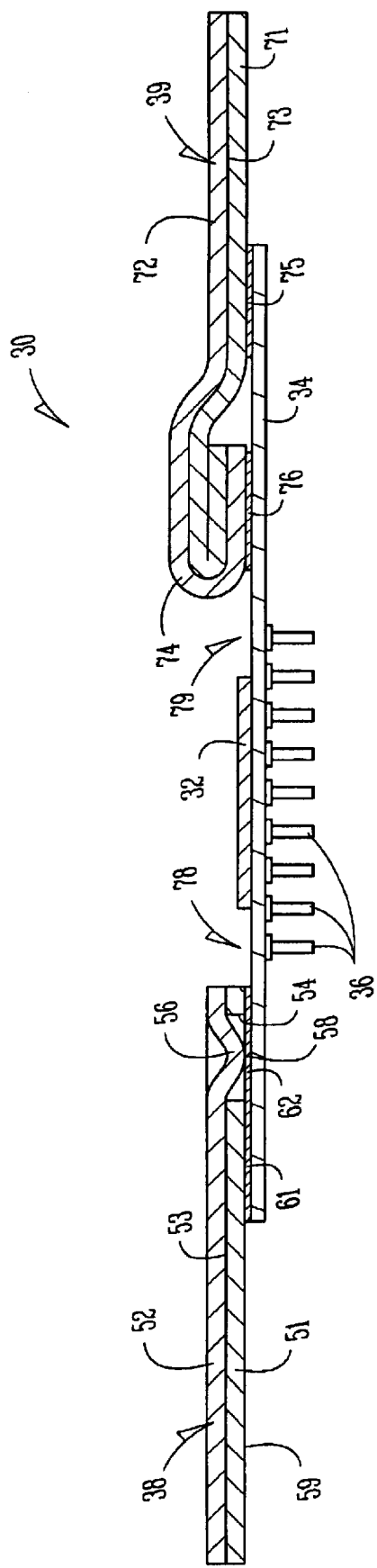
FIG. 3 is a simplified diagram similar to FIGS. 1 and 2 illustrating a package of the present invention.

The present invention provides a solution to thickness, weight, and/or rigidity limitations in an electronic package, and to loop inductance problems that are associated with prior art electronic packages. FIG. 3 shows an electronic package 30 of the present invention that overcomes the inductive path problem yet still has sufficient mechanical integrity. The package 30 includes a die 32 mounted onto an interposer 34. The die 32 may be any type of IC, such as a processor, memory chip or chipset component. In an example embodiment, die 32 is mounted to the interposer 34 using a conventional C4 joint that is supplemented by an underfill. Components 36 are mounted to the underside of the interposer 34. Components 36 are positioned underneath the die 32 to electrically connect other electronic components, such as capacitors or I/O devices, to the underside of interposer 34 opposite to die 32. The components 36 can be mounted to the underside of interposer 34 using conventional surface mount technology. Thin interposer 34 reduces the distance between die 32 and any electronic components that are functionally connected to die 32 in order to minimize the inductive loop within package 30.

Package 30 also includes laminated conductors 38, 39 that are electrically connected to interposer 34. Laminated conductors 38, 39 are preferably mounted adjacent to the die 32 on a same side of the interposer 34 as die 32. Laminated conductors 38, 39 support thin interposer 34 such that package 30 is capable of withstanding the mechanical load that may be applied to package 30 by any heat sinks and/or other thermal elements that are part of an electronic assembly where package 30 is located.

The mechanical support provided by laminated conductors 38, 39 minimizes package deflection during operation of a corresponding electronic system that includes package 30. Minimizing package deflection results in less damage to the package circuitry and is therefore a key component in meeting reliability requirements in electronic packages with thin interposers. In addition, laminated conductors 38, 39 provide mechanical support while not limiting the ability to place electronic components, such as capacitors and I/O devices, in electrical connection with die 32 on the underside of thin interposer 34 opposite to die 32.

Figure 4:
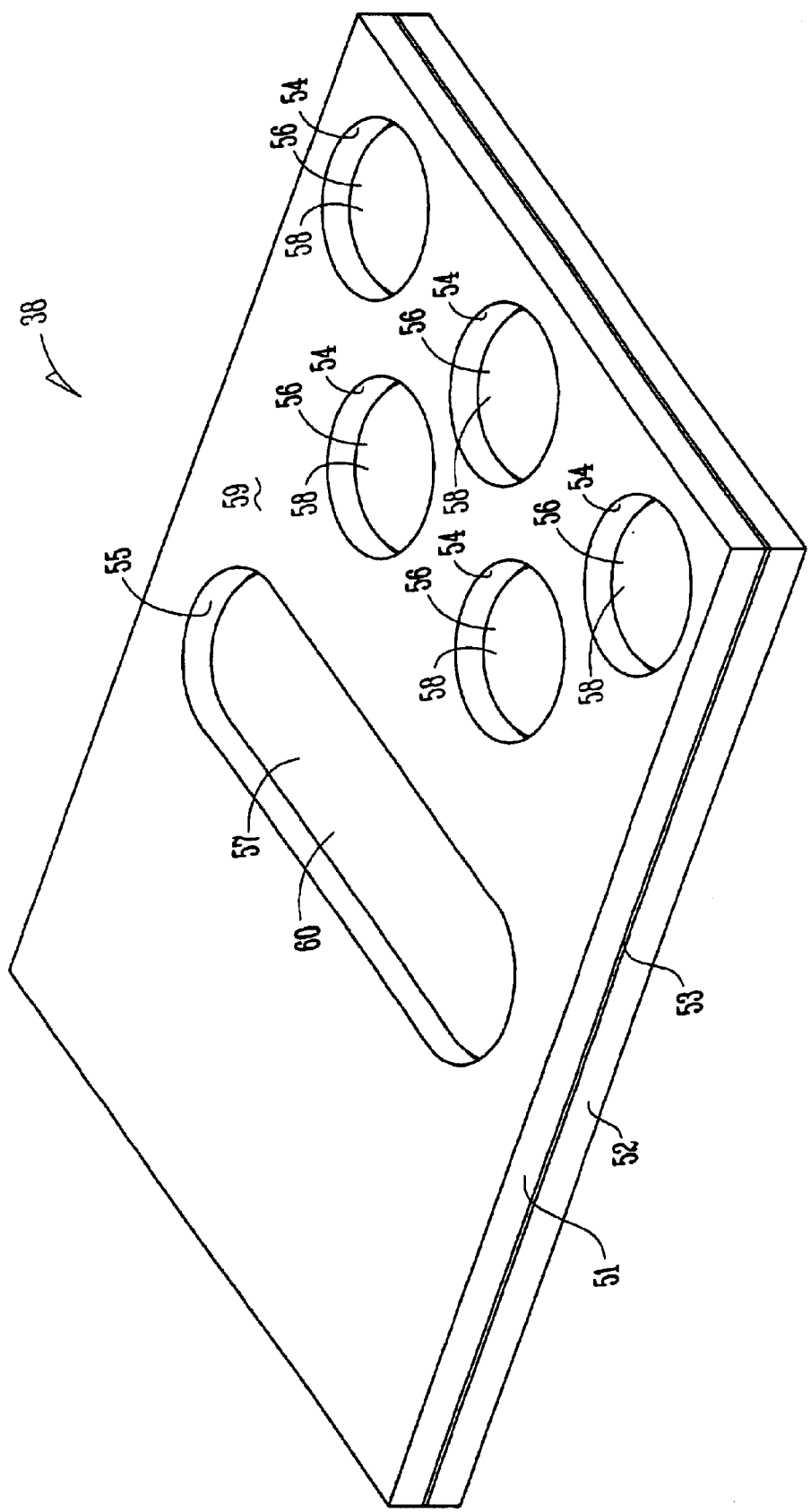
FIG. 4 is a perspective view of a laminated metal conductor strip that is used in the package illustrated in FIG. 3.

Laminated conductor as used herein refers to a pair of electrical conductors that are separated by a dielectric layer. One embodiment of laminated conductor 38 is shown in FIG. 4. Laminated conductor 38 includes a pair of conducting sheets 51, 52 that are separated by a dielectric layer 53. Sheet 51 includes a plurality of circular openings 54 and an oval-shaped opening 55. It should be noted that there may be any number and/or shape of openings in sheet 51.

Sheet 52 includes projections 56 that extend into circular openings 54 and an oblong projection 57 that extends into oval-shaped opening 55. Each projection 56 includes a tip 58 that is aligned with an exposed surface 59 of the other sheet 51 so that both sheets 51, 52 engage interposer 34 when laminated conductor 38 is assembled to interposer 34 (see FIG. 3). Oblong projection 57 includes an edge 60 that is also aligned with exposed surface 59 on sheet 51 to further engage both sheets 51, 52 with interposer 34. Although several openings 54, 55 are shown in FIG. 4, only one circular opening 53 is shown in FIG. 3 for the purposes of clarity.

Interposer 34 includes a section 61 that engages sheet 51 and another section 62 that engages the tips 58 and edge 60 on sheet 52. The sections 61, 62 on interposer 34 are electrically isolated from one another such that laminated conductor 38 may be used to supply direct current to die 32 during operation of an electronic assembly that includes electronic package 30. Dielectric layer 53 between sheets 51, 52 allows one sheet to be positively charged while the other sheet is negatively charged. When laminated conductor 38 supplies direct current to die 32, sheet 51 and section 61 could be positively or negatively charged while sheet 52 and section 62 are oppositely charged. The ability of laminated conductor 38 to provide direct current through thin interposer 34 in close proximity to die 32 will aid circuit designers in developing improved integrated circuits.

In addition, the large cross-section of sheets 51, 52 minimizes the resistance associated with supplying current to die 32. The lower resistance reduces the amount of heat that is generated during operation of the electronic assembly. Minimizing heat generation is desirable because heat can adversely effect the performance of electronic devices, especially die 32.

FIG. 3 shows an example embodiment of laminated conductor 39. Laminated conductor 39 includes a pair of conducting sheets 71, 72 that are separated by a dielectric layer 73. One end 74 of laminated conductor 39 is folded over so that both of the sheets 71, 72 engage interposer 34 when laminated conductor 39 is assembled to interposer 34. It should be noted that a different end, or only a portion of an end, may be folded over on laminated conductor 39 without departing from the scope of the present invention.

Interposer 34 includes one section 75 that engages sheet 71 and another section 76 that engages sheet 72. The sections 75, 76 on interposer 34 are electrically isolated from one another such that laminated conductor 39 may similarly be used to supply direct current to die 32 during operation of an electronic assembly that includes electronic package 30. When laminated conductor 39 supplies direct current to die 32, sheet 71 and section 75 could be positively or negatively charged while sheet 72 and section 76 are oppositely charged.

The laminated conductors 38, 39 may be mounted to interposer 34 such that there are spaces 78, 79 between each laminated conductor 38, 39 and die 32. The spaces 78, 79 make it easier to attach a heat sink, or some other thermal conductor, to die 32 to extract heat from die 32. The number, arrangement and/or location of laminated conductors 38, 39 will depend on the design of electronic package 30 and any electronic assembly that includes electronic package 30.

It should be noted that only one type, or multiple types, of laminated conductors may be used in electronic package 30. Laminated conductors 38, 39 are electrically coupled to sections 61, 62, 75, 76 on interposer 34 through any conventional attachment method. However, laminated conductors are 38, 39 are preferably coupled to interposer 34 to form a connection with high strength and minimal electrical resistance.

One such method for surface-mounting laminated conductors 38, 39 to interposer 34 includes soldering laminated conductors 38, 39 directly to the surface of the interposer using reflowable solder balls to establish a simple yet robust electrical connection. The joints may be used in combination with an underfill, such as an epoxy. The epoxy helps to hold the joint together when there is thermal expansion and contraction of the package during operation of the integrated circuit.

Interposer 34 may be formed in one or more layers and be made of metal and/or an organic material. Interposer 34 may also be formed in a thin, flexible, electrically insulating or conducting tape or film that are made from materials such as polyester, epoxy, and fiberglass. Interposer 34 may also include a plurality of conductive traces that are formed using any suitable conductive material, such as copper, aluminum or silver.

Interposer 34 preferably has a thickness of less than 1 mm. However, in other embodiments, a thicker or thinner interposer 34 may be used depending on what material the interposer 34 is made from.

The present invention also relates to a method of fabricating an electronic package 30. The method includes securing a die 32 to one side of an interposer 34 and securing laminated conductor 38, 39 to interposer 34 to supply current to die 32 and mechanically support interposer 34. Laminated conductors 38, 39 are preferably secured adjacent to interposer 34 on a side of interposer 34 that includes die 32. The method may further include securing a positive portion 51, 71 on each laminated conductor 38, 39 to a positive section 61,75 of interposer 34, and securing a negative portion 52, 72 on each laminated conductor 38, 39 to a negative section 62, 76 of interposer 34. The laminated conductors 38, 39 are preferably secured to the interposer 34 substantially simultaneously to decrease manufacturing costs.

The operations discussed above with respect to the described methods may be performed in a different order from those described herein. Also, it will be understood that the method of the present invention may be performed continuously.

Figure 5:
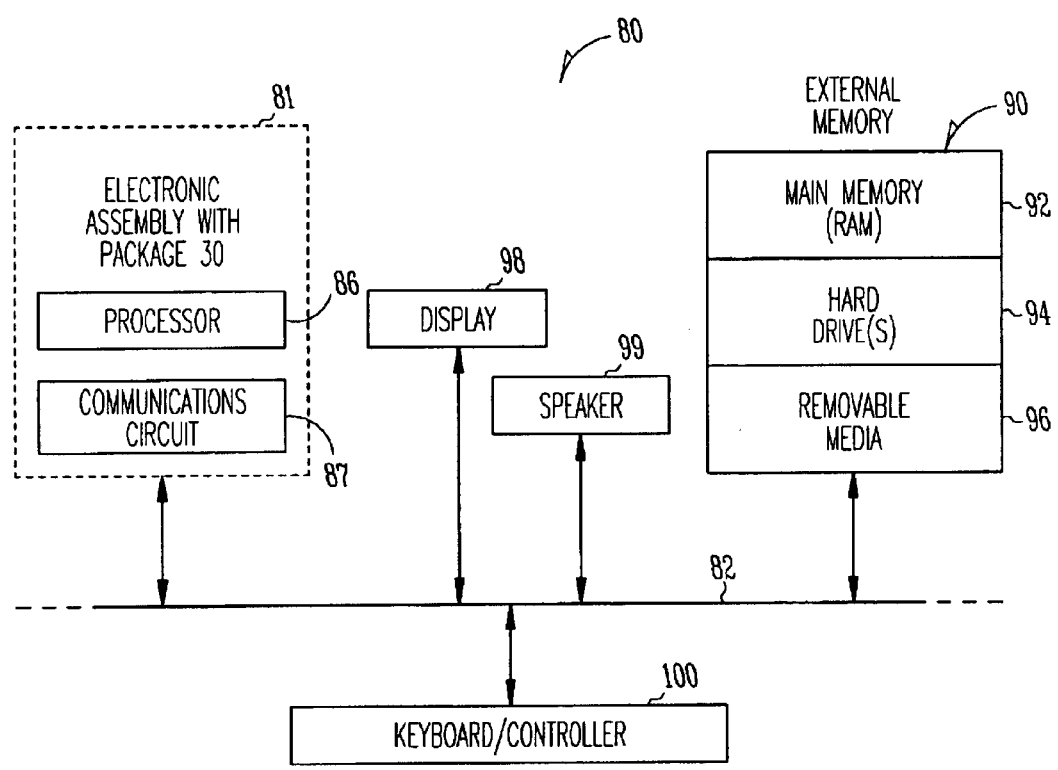
FIG. 5 is a block diagram of an electronic system incorporating at least one electronic assembly with an electronic package in accordance with the present invention.

FIG. 5 is a block diagram of an electronic system 80 incorporating at least one electronic assembly 81 that includes an electronic package, such as electronic package 30 shown in FIG. 3. The electronic package 30 in the electronic assembly 81 has minimal inductance loop yet maintains sufficient mechanical integrity. The electronic system 80 comprises a data processing system that includes a system bus 82 which electrically couples the various components of the electronic system 80 together. The system bus 82 may be a single bus or any combination of busses.

The electronic assembly 81 is coupled to the system bus 82 and may include any circuit or combination of circuits. In one embodiment, the electronic assembly 81 includes a processor 86 which can be of any type. As used herein, processor means any type of computer circuit such as, but not limited to, a microprocessor, a microcontroller, a graphics processor or a digital signal processor.

Other types of circuits that can be included in electronic assembly 81 are a custom circuit, an application-specific integrated circuit, such as communications circuit 87 for use in wireless devices such as cellular telephones, pagers, portable computers, two-way radios, and similar electronic systems.

The electronic system 80 may also include an external memory 90 that includes one or more memory elements suitable to the particular application. The memory elements may be in the form of a random access memory (RAM) 92, one or more hard drives 94, and/or one or more drives that handle removable media 96, such as floppy diskettes, compact disks (CDs) and digital video disks (DVDs). The electronic system 80 may also include a display device 98, a speaker 99, and a controller 100, such as a keyboard, mouse, trackball, game controller, microphone, voice-recognition device, or any other device that permits a system user to input information into and receive information from the electronic system 80.

As shown herein, the present invention can be implemented in a number of different embodiments, including an electronic package, an electronic system, a computer system, one or more methods of fabricating an electronic package, and one or more methods of fabricating an electronic assembly that includes the package. The elements, materials, geometries, dimensions, and sequence of operations can all be varied to suit particular packaging requirements.

FIGS. 1–5 are merely representational and are not drawn to scale. Certain proportions thereof may be exaggerated, while others may be minimized. FIGS. 3 and 4 illustrate various implementations of the invention that can be understood and appropriately carried out by those of ordinary skill in the art.

What is claimed is:

1. A method of fabricating an electronic package, the method comprising:
   securing a die to an interposer; and
   securing a laminated conductor to the interposer to supply current to the die and mechanically support the interposer, wherein securing a laminated conductor to the interposer includes securing a positive portion of the laminated conductor to a positive section of the interposer and securing a negative portion of the laminated conductor to a negative section of the interposer.

2. The method recited in claim 1, wherein securing the laminated conductor to the interposer includes securing the laminated conductor to the interposer on a side of the interposer that includes the die.

3. The method recited in claim 1, wherein securing the laminated conductor to the interposer includes securing the laminated conductor adjacent to the die.

4. An electronic package comprising:
   an interposer;
   a die secured to the interposer; and
   a laminated conductor secured to the interposer to mechanically support the interposer and to supply current to the die, wherein the laminated conductor includes a positive portion that is connected to a positive section of the interposer and a negative portion that is connected to a negative section of the interposer.

5. The electronic package of claim 4, wherein the interposer has a thickness that is less than 1 mm.

6. The electronic package of claim 4, wherein the interposer is a composite metal and organic material.

7. An electronic package comprising:
   an interposer;
   a die secured to the interposer; and
   a laminated conductor secured to the interposer to mechanically support the interposer and to supply current to the die, wherein the laminated conductor includes a pair of conducting sheets separated by a dielectric layer, one of the sheets including an opening and the other sheet including a projection that extends into the opening.

8. The electronic package of claim 7, wherein the sheet with the opening includes an exposed surface and the projection includes a tip that is substantially aligned with the exposed surface.

9. The electronic package of claim 8, wherein the exposed surface and the tip of the projection are engaged with the interposer.

10. An electronic package comprising:
    an interposer;
    a die secured to the interposer; and
    a laminated conductor secured to the interposer to mechanically support the interposer and to supply current to the die, wherein the laminated conductor includes a pair of conducting sheets separated by a dielectric layer, one end of the laminated conductor being folded over such that each of the conducting sheets engages the interposer.

11. The electronic package of claim 10, wherein the interposer includes an upper surface and a lower surface and the die and the laminated conductor are secured to the upper surface of the interposer with the laminated conductor adjacent to the die.

12. The electronic package of claim 11, further comprising an electronic component that is electrically coupled to the die and is secured to the lower surface of the interposer, the interposer being thin enough to reduce the inductive loop between the electronic component and the die.

13. A computer system comprising:

a bus;

a memory coupled to the bus;

a processor; and a package including an interposer and a laminated conductor secured to the interposer, the processor being secured to the interposer such that the laminated conductor electrically connects the processor to the bus and mechanically supports the interposer during operation of the computer system, wherein the laminated conductor includes a positive portion that is connected to a positive section of the interposer and a negative portion that is connected to a negative section of the interposer.

14. The computer system of claim 13, wherein the interposer includes an upper surface and a lower surface and the processor and the laminated conductor are secured to the upper surface of the interposer with the laminated conductor adjacent to the die.

15. The computer system of claim 14, further comprising an electronic component that is electrically coupled to the processor and is secured to the lower surface of the interposer, the interposer being thin enough to reduce the inductive loop between the electronic component and the processor.

16. A computer system comprising:

a bus;

a memory coupled to the bus;

a processor; and a package including an interposer and a laminated conductor secured to the interposer, the processor being secured to the interposer such that the laminated conductor electrically connects the processor to the bus and mechanically supports the interposer during operation of the computer system, wherein the laminated conductor includes a pair of conducting sheets separated by a dielectric layer, one of the sheets including an opening and the other sheet including a projection that extends into the opening.

17. The computer system of claim 16, wherein the sheet with the opening includes an exposed surface and the projection includes a tip that is substantially aligned with the exposed surface.

18. The computer system of claim 17, wherein the exposed surface and the tip of the projection are engaged with the interposer.

19. A computer system comprising:

a bus;

a memory coupled to the bus;

a processor; and a package including an interposer and a laminated conductor secured to the interposer, the processor being secured to the interposer such that the laminated conductor electrically connects the processor to the bus and mechanically supports the interposer during operation of the computer system, wherein the laminated conductor includes a pair of conducting sheets separated by a dielectric layer, one end of the laminated conductor being folded over such that each of the conducting sheets engages the interposer.

20. The computer system of claim 19, wherein the interposer has a thickness that is less than 1 mm.

21. The computer system of claim 19, wherein the interposer is a composite metal and organic material.

\* \* \* \* \*